(12) United States Patent
Huang et al.

(10) Patent No.: US 12,113,051 B2
(45) Date of Patent: Oct. 8, 2024

(54) DIE TO DIE INTERFACE CIRCUIT

(71) Applicant: Taiwan Semiconductor Manufacturing Company Ltd., Hsinchu (TW)

(72) Inventors: Tze-Chiang Huang, Saratoga, CA (US); King-Ho Tam, Hsinchu County (TW); Yu-Hao Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/301,817

(22) Filed: Apr. 17, 2023

(65) Prior Publication Data

US 2023/0260970 A1    Aug. 17, 2023

Related U.S. Application Data

(63) Continuation of application No. 17/363,121, filed on Jun. 30, 2021, now Pat. No. 11,658,158.

(60) Provisional application No. 63/074,153, filed on Sep. 3, 2020.

(51) Int. Cl.
*H01L 25/065* (2023.01)
*H01L 23/528* (2006.01)
*H01L 25/00* (2006.01)

(52) U.S. Cl.
CPC ...... *H01L 25/0657* (2013.01); *H01L 23/5286* (2013.01); *H01L 25/50* (2013.01); *H01L 2225/06513* (2013.01); *H01L 2225/06544* (2013.01)

(58) Field of Classification Search
CPC . H01L 25/0657; H01L 23/5286; H01L 25/50; H01L 2225/06513
See application file for complete search history.

(56) References Cited

U.S. PATENT DOCUMENTS

| | | | |
|---|---|---|---|
| 9,429,983 B1 | 8/2016 | Chall et al. | |
| 11,101,240 B2* | 8/2021 | Chung | H01L 25/0652 |
| 11,830,817 B2* | 11/2023 | Agarwal | H01L 23/5384 |

(Continued)

FOREIGN PATENT DOCUMENTS

| | | |
|---|---|---|
| CN | 110867434 A | 3/2020 |
| TW | 202002188 A | 1/2020 |
| TW | 202021047 A | 6/2020 |

OTHER PUBLICATIONS

Notice of Allowance on U.S. Appl. No. 17/363,121 DTD Jan. 23, 2023.

(Continued)

*Primary Examiner* — Thao P Le
(74) *Attorney, Agent, or Firm* — FOLEY & LARDNER LLP

(57) ABSTRACT

Disclosed herein are related to an integrated circuit including multiple dies stacked along a direction. In one aspect, the integrated circuit includes a first die, a second die, and a third die stacked along the direction. In one aspect, the first die includes a first interface circuit to generate a signal. In one aspect, the second die includes a second interface circuit to receive the signal from the first interface circuit and generate a replicate signal of the signal. In one aspect, the third die includes a third interface circuit to receive the replicate signal from the second interface circuit.

18 Claims, 13 Drawing Sheets

(56) References Cited

U.S. PATENT DOCUMENTS

| | | |
|---|---|---|
| 2017/0263536 A1 | 9/2017 | Lin |
| 2018/0076180 A1 | 3/2018 | Koyanagi |
| 2021/0098441 A1 | 4/2021 | Wuu et al. |
| 2021/0407942 A1* | 12/2021 | Yu ................. H01L 25/0652 |
| 2022/0068888 A1* | 3/2022 | Huang ................ H01L 25/50 |
| 2022/0262766 A1 | 8/2022 | Chen et al. |
| 2022/0278084 A1 | 9/2022 | Ong et al. |
| 2022/0384382 A1* | 12/2022 | Yu ..................... H01L 24/08 |
| 2022/0399294 A1 | 12/2022 | Dogiamis et al. |
| 2022/0406751 A1 | 12/2022 | Elsherbini et al. |
| 2022/0415814 A1 | 12/2022 | Waidhas et al. |
| 2022/0415815 A1 | 12/2022 | Waidhas et al. |
| 2024/0113078 A1* | 4/2024 | Noguchi ............. H01L 25/18 |
| 2024/0153879 A1* | 5/2024 | Shih ................. H01L 21/486 |

OTHER PUBLICATIONS

Taiwan Notice of Allowance on TW Appl. Ser. No. 110132708 dated May 2, 2022 (5 pages).

* cited by examiner

100B

DIE TO DIE INTERFACE CIRCUIT

CROSS-REFERENCE TO RELATED APPLICATION

This application is a continuation of U.S. Utility application Ser. No. 17/363,121, filed Jun. 30, 2021, which claims priority to and the benefit of U.S. Provisional Application No. 63/074,153, filed Sep. 3, 2020, each of which is incorporated herein by reference in its entirety for all purposes.

BACKGROUND

The recent trend in miniaturizing integrated circuits (ICs) has resulted in smaller devices which consume less power yet provide more functionality at higher speeds than before. In one aspect, the miniaturization in the ICs is achieved by advancement in fabrication processes. For example, multiple dies or integrated circuits can be stacked to improve storage or process capabilities.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
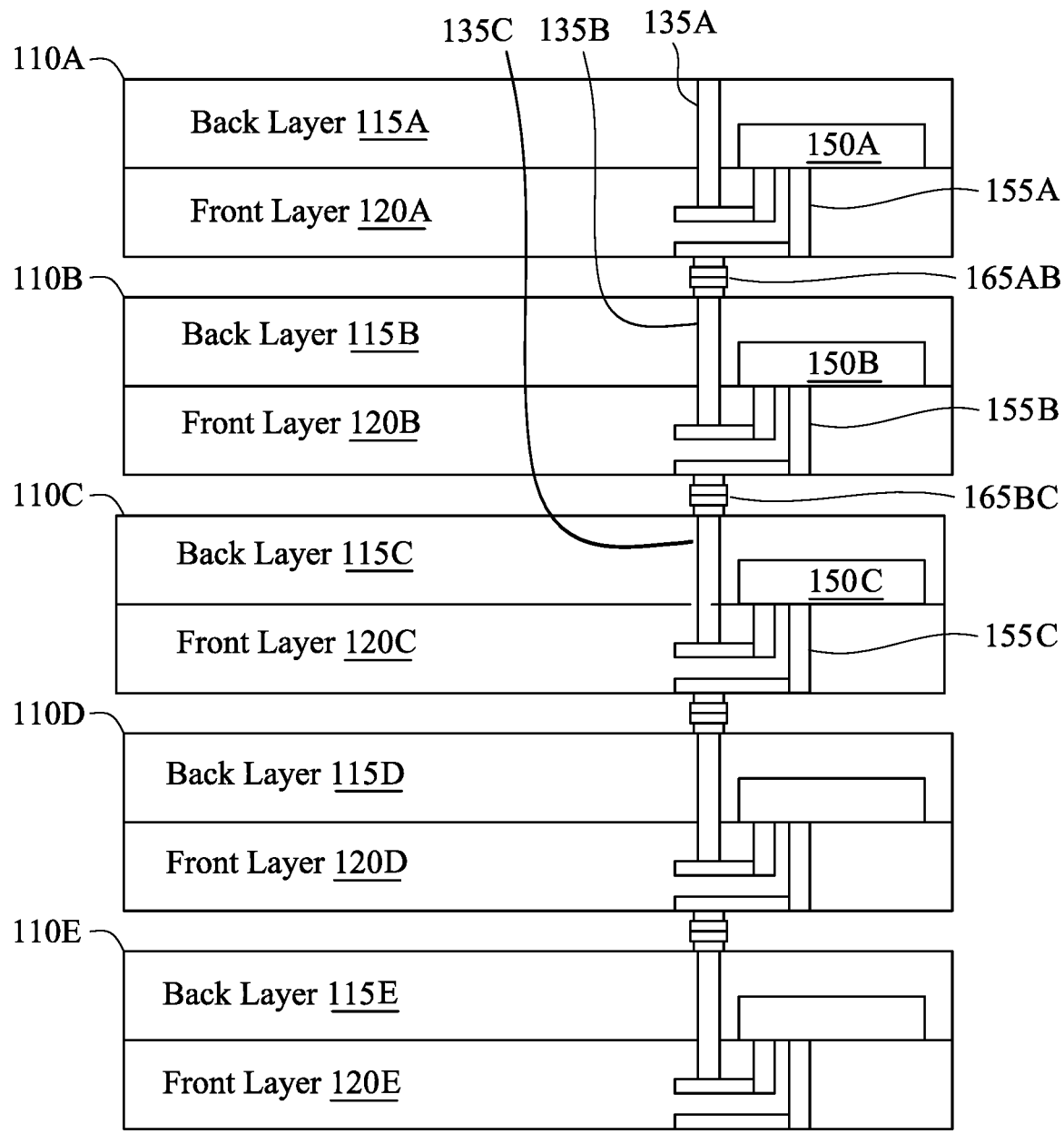
FIG. 1 is a diagram of an integrated circuit including multiple dies stacked along a direction, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit including multiple dies stacked along a direction is disclosed. In one aspect, the integrated circuit includes a first die, a second die, and a third die stacked along the direction. In one aspect, the first die includes a first interface circuit to generate a signal. In one aspect, the second die includes a second interface circuit to receive the signal from the first interface circuit and generate a replicate signal of the signal. The replicate signal may contain the same information as the signal received but may be delayed by a certain amount. In one aspect, the third die includes a third interface circuit to receive the replicate signal from the second interface circuit. The second interface circuit may propagate the signal between the first interface circuit and the second interface circuit, while electrically isolating or separating electrical loads (e.g., resistive load, capacitive load, etc.) of metal rails in different dies.

Advantageously, the disclosed integrated circuit can achieve speed improvement. By employing interface circuits to generate a replicate signal to transmit to a subsequent die while electrically isolating or separating electrical loads of metal rails in different dies, capacitive loading of metal rails through multiple dies can be reduced. By reducing the capacitive loading, speed of communication among different dies of the integrated circuit can be enhanced.

In accordance with some embodiments, a method of simulating an integrated circuit including multiple dies stacked along a direction is disclosed. In some embodiments, the method includes performing, by a processor, a first simulation for a die of the integrated circuit across process corners. In some embodiments, the method includes generating, by the processor, a timing model of the die according to the first simulation. The timing model may be an aggregation of simulation results across different process corners. In some embodiments, the method includes performing, by the processor, a second simulation for multiple dies of the integrated circuit stacked along the direction. Each of the multiple dies may be represented by the timing model to perform the second simulation.

Advantageously, the disclosed method can perform circuit simulation of an integrated circuit including multiple dies stacked along a direction in an efficient manner. In one aspect, electrical loads (e.g., capacitive load, resistive load, etc.) of metal rails of multiple dies of the integrated circuit are electrically isolated or separated among each other through interface circuits of the multiple dies, such that each die can be modeled independently. Hence, circuit simulation of a single die can be performed for various process corners to generate a timing model, and the timing model can be applied or utilized for performing circuit simulation of multiple dies stacked along the direction. By performing circuit simulation of multiple dies based on the timing model of the single die rather than performing exhaustive circuit simulation of multiple dies across various process corners, computational resources (e.g., storage space and processing power) for performing circuit simulation can be conserved.

FIG. 1 is a diagram of an integrated circuit 100A including multiple dies 110A . . . 110E stacked along a direction (e.g., Y-direction), in accordance with one embodiment. In some embodiments, the integrated circuit 100A includes conductive bumps 165. Each conductive bump 165 may include conductive materials (e.g., metal). Each conductive bump 165 may electrically couple between two corresponding dies 110. Through conductive bumps 165, different dies 110A . . . 110E may communicate among each other. In some embodiments, the integrated circuit 100A includes more, fewer, or different components than shown in FIG. 1. For example, the integrated circuit 100A includes a different number of dies 110 stacked along the direction (e.g., Y-direction) than shown in FIG. 1.

In some embodiments, each die 110 includes at least two layers 115, 120. The layer 115 (e.g., also referred to as a "back layer 115" herein) may be a semiconductor layer, in which one or more transistors can be formed. For example, metal oxide semiconductor field effect transistor (MOSFET), gate all around field effect transistor (GAAFET), fin field effect transistor (FinFET) or any combination of them can be formed in the semiconductor layer 115. The layer 120 (also referred to as a "front layer 120" herein) may be an insulating layer to protect one or more transistors of the semiconductor layer 115. In some embodiments, the layer 115 is disposed or stacked above the layer 120 along the direction (e.g., Y-direction). In some embodiments, the layer 120 is disposed or stacked above the layer 115 along the direction (e.g., Y-direction).

In some embodiments, each die 110 includes metal rails 135, 155 and a die-to-die interface circuit 150. The metal rails 135, 155 may vertically extend along the Y-direction. The metal rail 135 may extend through the layer 115 and electrically couple between a conductive bump 165 and the die-to-die interface circuit 150. The metal rail 155 may extend through the layer 120 and electrically couple between a subsequent conductive bump 165 and the die-to-die interface circuit 150. The die-to-die interface circuit 150 (also referred to as an "interface circuit 150" herein) may be formed or disposed in the layer 115. In one aspect, the interface circuit 150 is a circuit that interfaces between i) one or more circuits of the die 110 and ii) other circuits in different dies. For example, the interface circuit 150 may receive one or more signals through the metal rail 135, the metal rail 155, or a combination of them, and store the received one or more signals. According to the stored one or more signals, one or more circuits in the die 110 may perform various computations. For example, the interface circuit 150 may generate one or more signals and transmit the one or more signals through the metal rail 135, the metal rail 155, or a combination of them.

In this configuration, the interface circuits 150 may propagate a signal through the metal rails 135, 155 of different dies 110 with improved operating speed. In one aspect, an interface circuit 150 may receive a signal through one of the metal rails 135, 155 and transmit a replicate signal of the signal through the other of the metal rails 135, 155, while electrically isolating between electrical loads (e.g., capacitive load, resistive load, etc.) of the metal rails 135, 155. By electrically isolating between electrical loads of the metal rails 135, 155, the metal rails 135, 155 of multiple dies 110 may have reduced capacitive loading. By reducing capacitive loading, a signal can be exchanged or propagated through different dies 110 stacked along the direction (e.g., Y-direction) with improved speed.

Figure 2:
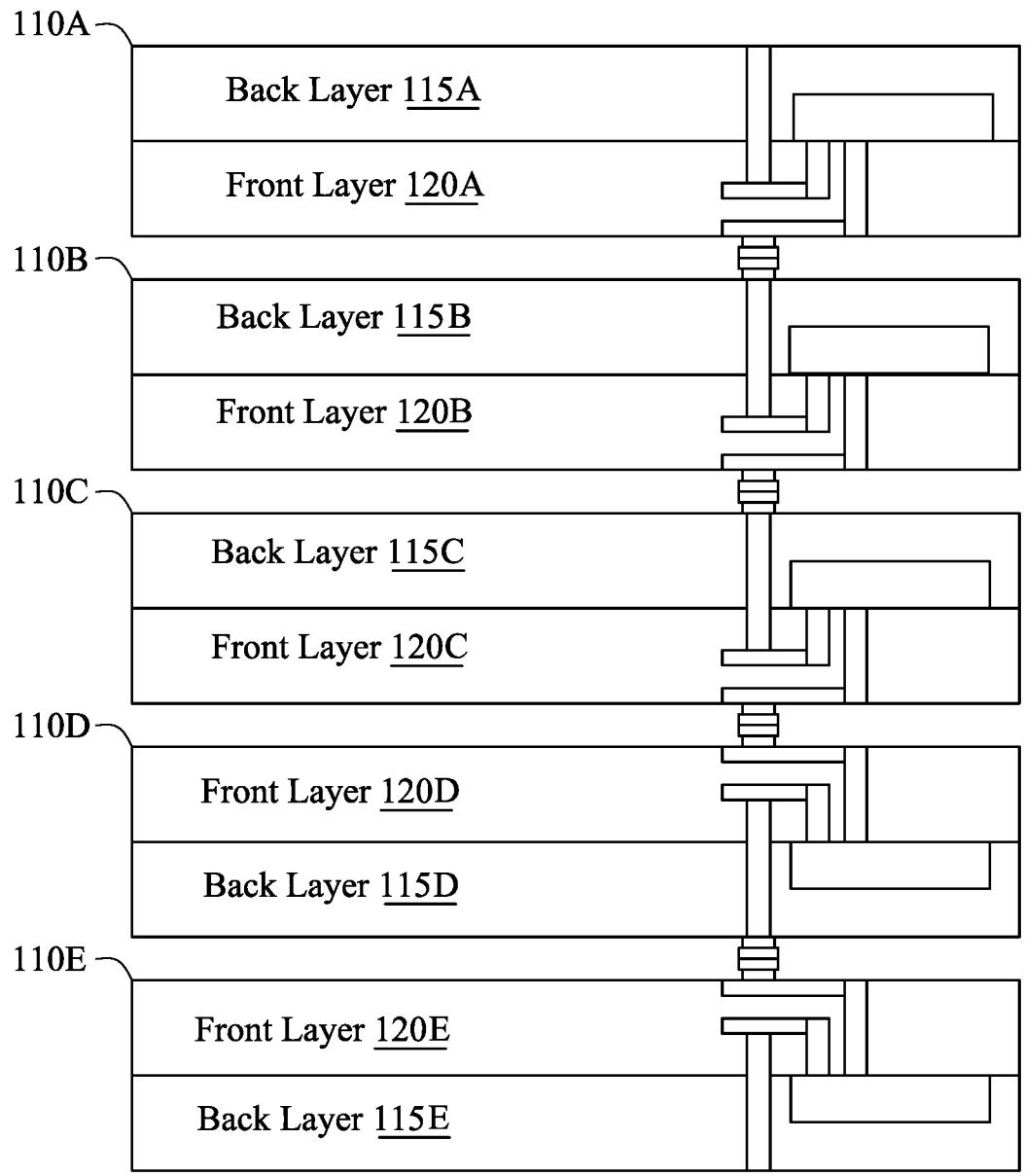
FIG. 2 is a diagram of an integrated circuit including multiple dies stacked along a direction, in accordance with one embodiment.

FIG. 2 is a diagram of an integrated circuit 100B including multiple dies 110A . . . 110E stacked along the direction (e.g., Y-direction), in accordance with one embodiment. The integrated circuit 100B of FIG. 2 is similar to the integrated circuit 100A of FIG. 1, except each of the dies 110D, 110E has the layer 120 disposed above the layer 115 along the direction (e.g., Y-direction). Accordingly, the layer 120 of the die 110C and the layer 120 of the die 110D may face other. Switching the order of the layers 120, 115 may provide flexibility in stacking different dies 110.

Figure 3:
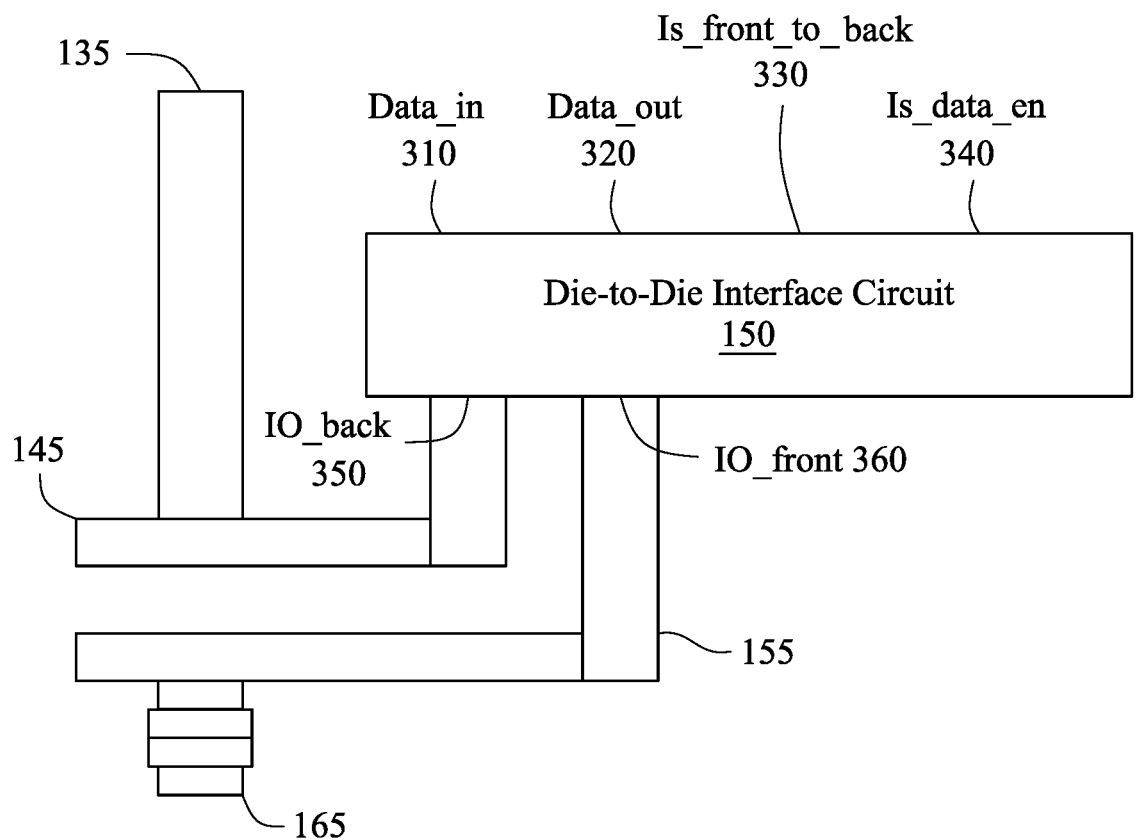
FIG. 3 is a diagram of a die-to-die interface circuit and metal rails connected to the die-to-die interface circuit, in accordance with one embodiment.

FIG. 3 is a diagram of a die-to-die interface circuit 150 and metal rails 135, 155 connected to the die-to-die interface circuit 150, in accordance with one embodiment. In some embodiments, the interface circuit 150 includes IO_back port 350, IO_front port 360, Data_in port 310, Data_out port 320, Is_front_to_back port 330, and Is_data_en port 340. In one aspect, the interface circuit 150 may receive control signals through the Is_front_to_back port 330 and the Is_data_en port 340, and transmit or receive one or more signals through the IO_back port 350, IO_front port 360, Data_in port 310, Data_out port 320. In some embodiments, the interface circuit 150 can be replaced by a different component or a circuit that can perform the functionality of the interface circuit 150 described herein.

In some embodiments, the interface circuit 150 includes the IO_back port 350 and the IO_front port 360 electrically coupled to different dies 110. In one configuration, the IO_back port 350 is connected to the metal rail 135. Through the metal rail 135, the interface circuit 150 may receive a signal from or transmit a signal to another interface circuit 150 of a different die 110 at the IO_back port 350. In one configuration, the IO_front port 360 is connected to the metal rail 155. Through the metal rail 155, the interface circuit 150 may receive a signal from or transmit a signal to another interface circuit 150 of a different die 110 at the IO_front port 360.

In some embodiments, the interface circuit 150 includes the Data_in port 310 and the Data_out port 320 electrically coupled to one or more circuits within the same die 110. The interface circuit 150 may be connected to one or more circuits at the Data_in port 310 and the Data_out port 320 through metal rails extending within the die 110, for example, along the X-direction. At the Data_in port 310, the interface circuit 150 may receive a signal from one or more circuits within the same die 110. At the Data_out port 320, the interface circuit 150 may transmit a signal to one or more circuits within the same die 110.

In some embodiments, the interface circuit 150 includes the Is front to back port 330 and the Is_data_en port 340 coupled to a controller (not shown). The controller may be disposed on the same die 110 with the interface circuit 150 or may be disposed on a different die 110. The interface circuit 150 may be connected to the controller through one or more metal rails. At the Is_front_to_back port 330 and the Is_data_en port 340, the interface circuit 150 may receive control signals from the controller, and receive signals from or output signals at the IO_back port 350, IO_front port 360, Data_in port 310, Data_out port 320, according to the control signals. For example, in response to a control signal having a low state '0' at the Is_data_en port 340 and a control signal having a high state '1' at the Is_front_to_back port 330, the interface circuit 150 may receive a signal (e.g., data signal or clock signal) at the IO_front port 360 through the metal rail 155, and generate, at the IO_back port 350 and the Data_out port 320, replicate signals of the received signal. For example, in response to a control signal having a low state '0' at the Is_data_en port 340 and a control signal having a low state '0' at the Is_front_to_back port 330, the interface circuit 150 may receive a signal (e.g., data signal or clock signal) at the IO_back port 350 through the metal rail 135, and generate, at the IO_front port 360 and the Data_out port 320, replicate signals of the received signal. For example, in response to a control signal having a high state '1' at the Is_data_en port 340, the interface circuit 150 may receive a signal (e.g., data signal or clock signal) at the Data_in port 310 through one or more circuits in the same die 110, and generate, at the IO_back port 350 and the IO_front port 360, replicate signals of the received signal.

Figure 4:
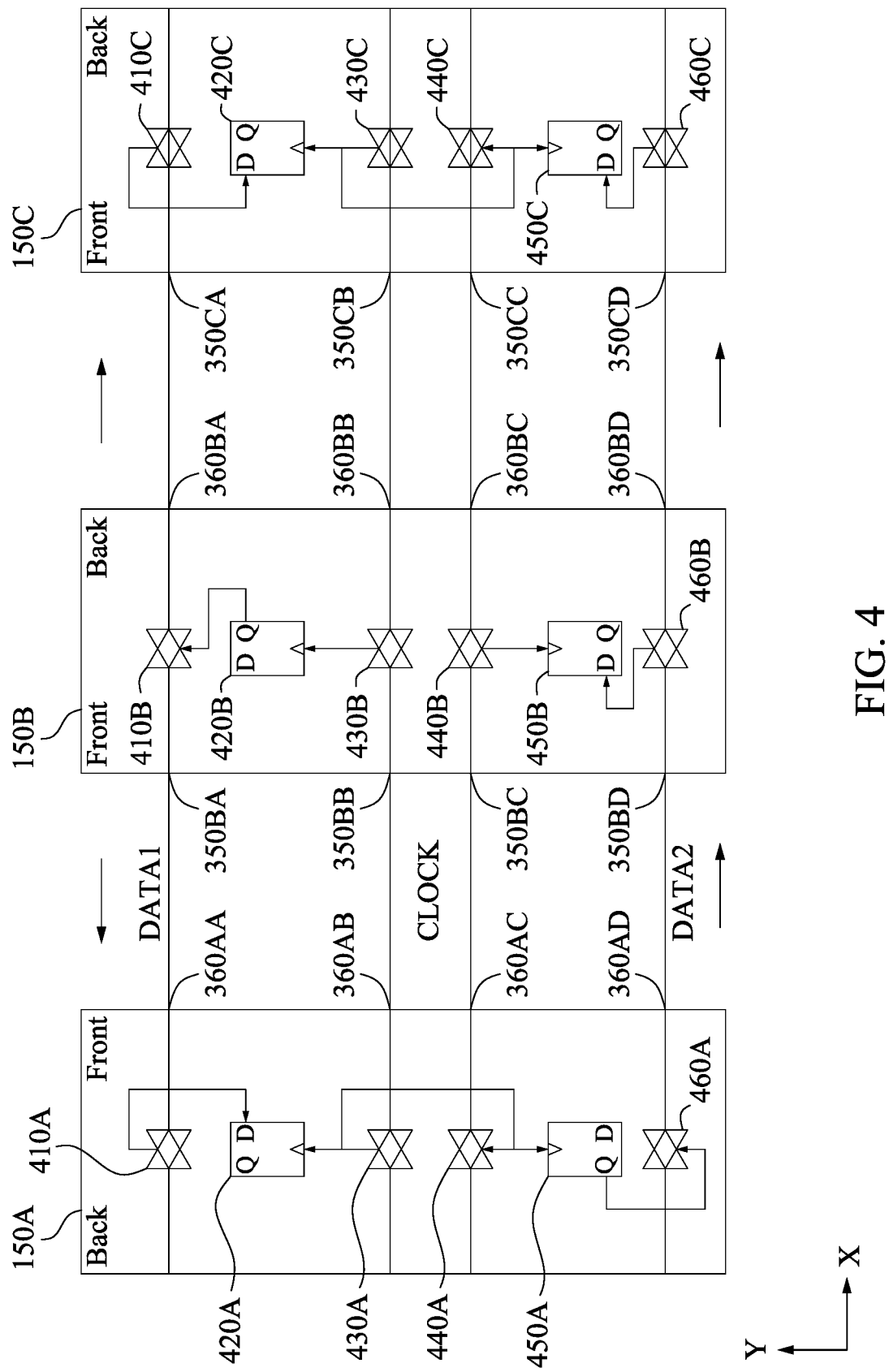
FIG. 4 is a schematic diagram showing connections of die-to-die interface circuits, in accordance with some embodiments.

FIG. 4 is a schematic diagram showing connections of die-to-die interface circuits 150A, 150B, 150C, in accordance with some embodiments. In some embodiments, the interface circuit 150A corresponds to the interface circuit 150 of the die 110A, the interface circuit 150B corresponds to the interface circuit 150 of the die 110B, and the interface circuit 150C corresponds to the interface circuit 150 of the die 110C. In one configuration, the interface circuit 150A includes ports 360AA-360AD connected to ports 350BA . . . 350BD of the interface circuit 150B, respectively, through metal rails (e.g., metal rails 135, 155) extending along the Y-direction. In one configuration, the interface circuit 150B includes ports 360BA-360BD connected to ports 350CA . . . 350CD of the interface circuit 150C, respectively, through metal rails (e.g., metal rails 135, 155) extending along the Y-direction. In this configuration, interface circuits 150A, 150B, 150C may exchange data in a synchronous manner.

In one configuration, the interface circuit 150B may transmit or provide a data signal and a clock signal to the interface circuits 150A, 150C. In one implementation, the interface circuit 150B includes buffer circuits 410B, 430B, and a flip flop 420B. The buffer circuit 430B may receive a clock signal from a circuit within the die 110B, and generate, at the ports 350BB, 360BB, replicate clock signals of the received clock signal. The buffer circuit 430B may also transmit or output a replicate clock signal of the clock signal to a clock port of the flip flop 420B. The flip flop 420B may receive a data signal at a "D" input port, for example, from a circuit within the die 110B, and output the data signal at the "Q" output port, in synchronous to the replicate clock signal at the clock port. For example, the flip flop 420B may output, at the "Q" output port, the data signal received at the "D" input port, in response to a rising edge of the replicate clock signal at the clock port. The buffer circuit 410B may receive the data signal from the "Q" output port of the flip flop 420B, and generate, at the ports 350BA, 360BA, replicate data signals of the data signal.

In one configuration, the interface circuit 150A may receive a data signal and a clock signal from the interface circuit 150B. In one implementation, the interface circuit 150A includes buffer circuits 410A, 430A, and a flip flop 420A. The buffer circuit 410A may receive the replicate data signal from the buffer circuit 410B through the port 360AA, and generate another replicate data signal of the replicate data signal. The buffer circuit 410A may transmit or output the another replicate data signal to a "D" input port of the flip flop 420A. Meanwhile, the buffer circuit 430A may receive a replicate clock signal from the buffer circuit 430B through the port 360AB, and generate another replicate clock signal of the received clock signal. The buffer circuit 430A may also transmit or output the another replicate clock signal to a clock port of the flip flop 420A. The flip flop 420A may receive the another replicate data signal at the "D" input port, and output or store the another replicate data signal at the "Q" output port, in synchronous to the another replicate clock signal at the clock port. For example, the flip flop 420A may store or output, at the "Q" output port, the another replicate data signal received at the "D" input port, in response to a rising edge of the another replicate clock signal at the clock port.

In one configuration, the interface circuit 150C may receive a data signal and a clock signal from the interface circuit 150B at the ports 350CA, 350CB. In one implementation, the interface circuit 150C includes buffer circuits 410C, 430C, and a flip flop 420C. The buffer circuits 410C, 430C, and the flip flop 420C may be configured and operate in a similar manner as the buffer circuits 410A, 430A, and the flip flop 420A of the interface circuit 150A. Thus, detailed description of duplicated portion thereof is omitted herein for the sake of brevity.

In one configuration, the interface circuit 150A may transmit or provide a data signal and a clock signal to the interface circuit 150B. In one implementation, the interface circuit 150A includes buffer circuits 440A, 460A, and a flip flop 450A. The buffer circuit 440A may receive a clock signal from the buffer circuit 430A, and generate, at the port 360AC, a replicate clock signal of the received clock signal. The buffer circuit 440A may also transmit or output a replicate clock signal to a clock port of the flip flop 450A. The flip flop 450A may receive a data signal at a "D" input port, for example, from a circuit within the die 110A, and output the data signal at the "Q" output port, in synchronous to the replicate clock signal at the clock port. For example, the flip flop 450A may output, at the "Q" output port, the data signal received at the "D" input port, in response to a rising edge of the replicate clock signal at the clock port. The buffer circuit 460A may receive the data signal from the "Q" output port of the flip flop 450A, and generate, at the port 360AD, a replicate data signal of the data signal.

In one configuration, the interface circuit 150B may receive the replicate data signal and the replicate clock signal from the interface circuit 150A. In one implementation, the interface circuit 150B includes buffer circuits 440B, 460B, and a flip flop 450B. The buffer circuit 460B may receive the replicate data signal from the buffer circuit 460A through the port 350BD and generate another replicate data signal of the received data signal. The buffer circuit 460B may transmit or output the another replicate data signal to a "D" input port of the flip flop 450B. Meanwhile, the buffer circuit 440B may receive a replicate clock signal from the buffer circuit 440A through the port 350BC and generate another replicate clock signal of the received clock signal. The buffer circuit 440B may also transmit or output the another replicate clock signal to a clock port of the flip flop 450B. The flip flop 450B may receive the another replicate data signal at the "D" input port, and output or store the another replicate data signal at the "Q" output port, in synchronous to the another replicate clock signal at the clock port. For example, the flip flop 450B may store or output, at the "Q" output port, the another replicate data signal received at the "D" input port, in response to a rising edge of the another replicate clock signal at the clock port. The buffer circuit 460B may also generate an additional replicate data signal of the replicate data signal received and transmit or output the additional replicate data signal at the port 360BD. Similarly, the buffer circuit 440B may generate an additional replicate clock signal of the replicate clock signal received and transmit or output the additional replicate clock signal at the port 360BC.

In one configuration, the interface circuit 150C may receive a data signal and a clock signal from the interface circuit 150B at the ports 350CC, 350CD. In one implementation, the interface circuit 150C includes buffer circuits 440C, 460C, and a flip flop 450C. The buffer circuits 440C, 460C, and the flip flop 450C may be configured and operate in a similar manner as the buffer circuits 440B, 460B, and the flip flop 450B of the interface circuit 150B. Thus, detailed description of duplicated portion thereof is omitted herein for the sake of brevity.

Advantageously, the interface circuits 150A, 150B, 150C may communicate among each other in a synchronous manner. As described above, the clock signal can be shared or propagated among different interface circuits 150A, 150B, 150C through the buffer circuits 430A-430C, and 440A-440C. Moreover, a data signal in synchronous to the clock signal can be transmitted by the buffer circuit 410B, and received by the buffer circuits 410A, 410C. In addition, a data signal in synchronous to the clock signal can be transmitted by the buffer circuit 460A, and received by the buffer circuits 460B, 460C. Accordingly, the interface circuits 150A, 150B, 150C may share synchronous data among each other.

Figure 5:
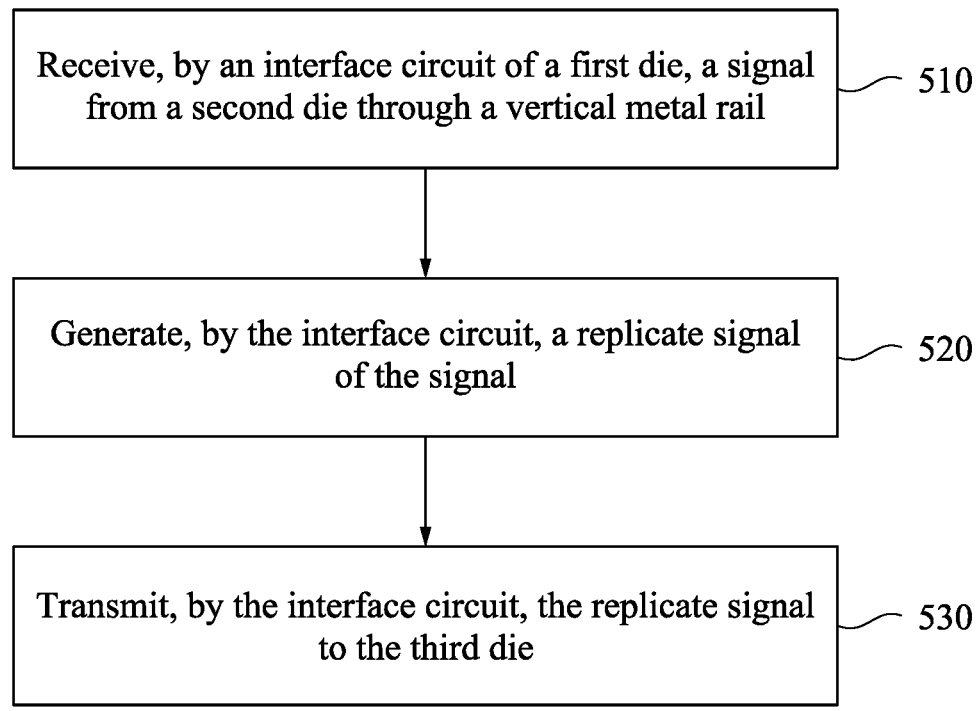
FIG. 5 is a flowchart showing a method of propagating a signal through multiple dies stacked along a direction, in accordance with some embodiments.

FIG. 5 is a flowchart showing a method 500 of propagating a signal through multiple dies stacked along a direction, in accordance with some embodiments. In some embodiments, the method 500 is performed by the interface circuit 150B of the die 110B. In some embodiments, the method 500 is performed by other entities. In some embodiments, the method 500 includes more, fewer, or different operations than shown in FIG. 5.

In an operation 510, the interface circuit 150B receives a signal from an interface circuit 150A of a preceding die 110A. The signal may be a data signal or a clock signal. The interface circuit 150B may receive the signal through a vertical metal rail, for example, extending along the Y-direction. The vertical metal rail may be the metal rail 135.

In an operation 520, the interface circuit 150B generates a replicate signal of the signal received. The replicate signal may contain the same information as the received signal but may be delayed from the received signal by a certain amount. For example, a voltage or a logic state of the replicate signal may be same as a voltage or a logic state of the received signal.

In an operation 530, the interface circuit 150B transmits the replicate signal to an interface circuit 150C of a subsequent die 110C. The interface circuit 150B may transmit the signal through another vertical metal rail, for example, extending along the Y-direction. The another vertical metal rail may be the metal rail 155.

Advantageously, the interface circuits 150 in different dies 110 may propagate or exchange a signal in a time efficient manner. In one aspect, the interface circuit 150 of a die 110 can electrically isolate between electrical loads of different metal rails 135, 155 of the die 110. Accordingly, the interface circuit 150B may drive metal rails 135, 155 rather than a large number of metal rails in different dies 110 stacked along the Y-direction. Accordingly, capacitive load of the interface circuits 150 can be reduced to achieve speed improvement.

Figure 6:
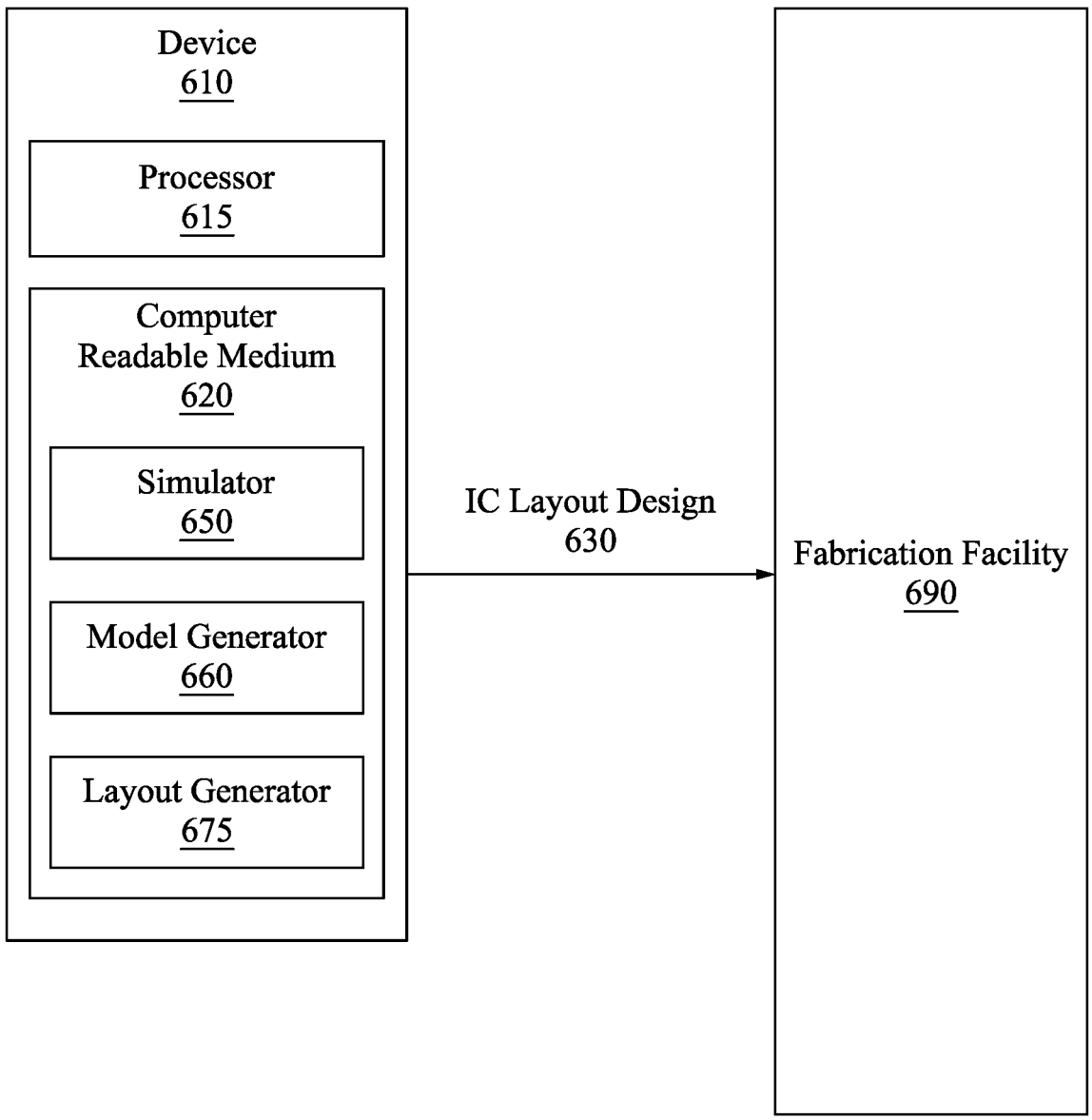
FIG. 6 is a diagram showing a device to perform a circuit simulation of an integrated circuit including multiple dies stacked along a direction, in accordance with some embodiments.

FIG. 6 is a diagram showing a system 600 to generate an integrated circuit, in accordance with some embodiments. In some embodiments, the system 600 includes a device 610 that provides an integrated circuit (IC) layout design 630 (also referred to as "layout design 630" herein) to a fabrication facility 690, for example through a network connection. The device 610 may be a computing device operated by a user (or a circuit designer). The layout design 630 may indicate locations and sizes of a set of polygons corresponding to various structures of IC. The layout design 630 may be in GDSII format. The fabrication facility 690 may receive the layout design 630 and fabricate multiple ICs according to the layout design 630.

In some embodiments, the device 610 includes one or more processors 615 and a non-transitory computer readable medium 620 storing instructions when executed by the one or more processors 615 cause the one or more processors 615 to perform various processes or operations for generating the layout design 630. In some embodiments, the non-transitory computer readable medium 620 stores software applications including a circuit simulator 650, a model generator 660, and a layout generator 675. These applications may assist a user of the device 610 to generate the layout design 630. In some embodiments, the non-transitory computer readable medium 620 stores more, fewer, or different applications than shown in FIG. 6.

In some embodiments, the simulator 650 is a software application to simulate or predict a performance a circuit design. The simulator 650 may simulate the performance of the circuit design in response to various conditions applied. For example, the simulator 650 may perform transient simulations of a die across various process corners. Examples of process corners include slow corner, worst corner, fast corner, best corner, etc. In one aspect, circuits located in different corners of the same die may have different characteristics, according to process variations. By performing simulations across different process corners, reliability of circuits can be tested to improve yield. The simulator 650 may perform simulation on a gate level design, a logic level design, or a combination of them. Based on the simulation result, the user may adjust or modify the gate level design or the logic level design of the integrated circuit.

In some embodiments, the model generator 660 is a software application to generate a timing model of a die of the integrated circuit. In one approach, the model generator 660 can combine or aggregate simulation results of a die across various process corners. The timing model of the die allows the simulator 650 to perform simulation of multiple dies stacked along a direction (e.g., Y-direction) in an efficient manner as described below with respect to FIGS. 7 through 8A and 8B.

In some embodiments, the layout generator 675 is a software application for generating the layout design 630. In one aspect, the layout generator 675 provides a graphical user interface that allows a user to draw or define locations and sizes of polygons corresponding to various layout components. In one aspect, the layout generator 675 can automatically generate the layout design 630 based on the logic level design or the gate level design. The layout generator 675 may generate the layout design 630 in GDSII format.

Figure 7:
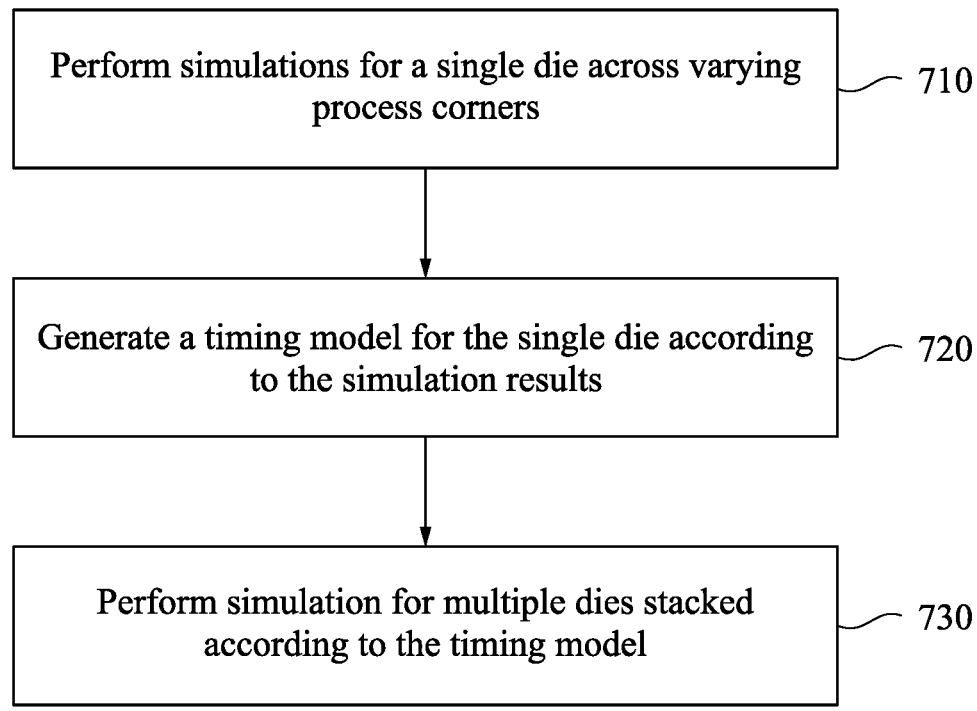
FIG. 7 is a flowchart showing a method of performing a circuit simulation of an integrated circuit including multiple dies stacked along a direction, in accordance with some embodiments.

FIG. 7 is a flowchart showing a method 700 of simulating an integrated circuit (e.g., integrated circuit 100) including multiple dies 110 stacked along a direction, in accordance with some embodiments. The method 700 may be performed by the device 610 of FIG. 6. In some embodiments, the method 700 is performed by other entities. In some embodiments, the method 700 includes more, fewer, or different operations than shown in FIG. 7.

In an operation 710, the device 610 performs simulations for a single die across varying process corners. For example, the simulator 650 may perform transient simulations of signals propagated from one end of the metal rail 135 to another end of the metal rail 155 under different operating conditions (or different process corners).

In an operation 720, the device 610 generates a timing model for the single die according to the simulation results from the operation 710. In one aspect, the timing model can represent predicted performances signals propagated from one end of the metal rail 135 to another end of the metal rail 155 under different operating conditions (or different process corners). For example, the model generator 660 can combine or aggregate different simulation results performed under different operating conditions (or different process corners) to generate the timing model.

In an operation 730, the device 610 performs simulation for multiple dies stacked along a direction (e.g., Y-direction) according to the timing model. For example, the model generator 660 may generate replicates of the timing model of the single die. The replicates of the timing model may be in cascade. Each of the replicates may represent a corresponding die 110. The simulator 650 may perform simulations of the integrated circuit 100 according to the replicates of the timing model in cascade. For example, the simulator 650 may perform timing analysis of a signal propagated from a first die (e.g., die 110A) to a last die (e.g., die 110C) through interface circuits 150 and metal rails 135, 155 of multiple dies 110 based on the replicates of the timing model. According to the simulation performed in the operation 730, a circuit design may be modified, and a layout design 630 describing or indicating locations and shapes of various components of the circuit design can be generated.

Advantageously, the device 610 can perform simulations of the integrated circuit including multiple dies 110 stacked along a direction (e.g., Y-direction) in an efficient manner. In one aspect, electrical loads of metal rails 135, 155 of multiple dies 110 are electrically isolated or separated among each other through interface circuits 150 of the multiple dies 110, such that each die 110 can be modeled independently. Hence, circuit simulation of a single die 110 can be performed for various process corners to generate a timing model, and the timing model can be applied or utilized for performing circuit simulation of multiple dies 110 stacked along the direction (e.g., Y-direction). By performing circuit simulation of multiple dies 110 based on the timing model of the single die 110 rather than performing exhaustive circuit simulation of multiple dies 110 across various process corners, computational resources (e.g., storage space and processing power) for performing circuit simulation can be conserved.

Figure 8A:
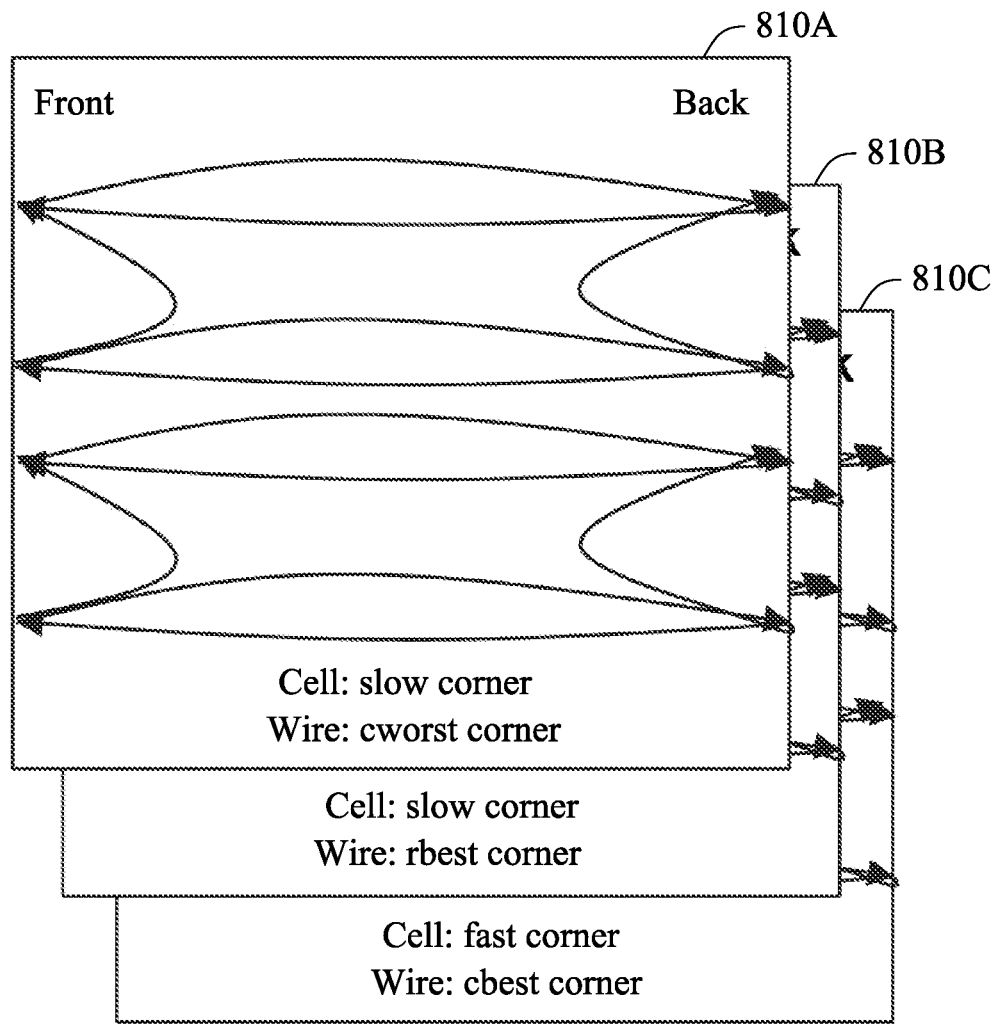
FIG. 8A is a diagram showing multiple simulation results of a single die across different process corners, in accordance with some embodiments.

FIG. 8A is a diagram showing multiple simulation results 810A, 810B, 810C of a single die 110 across different process corners, in accordance with some embodiments. In one example, the simulator 650 can perform transient simulations of signals propagated from an end of the metal rail 135 to an end of the metal rail 155, across various process corners. For example, the simulation result 810A is a result of the transient simulation under a slow corner for a cell (or transistor) and a worst corner for a parasitic capacitance of a wire. For example, the simulation result 810B is a result of the transient simulation under a slow corner for a cell (or transistor) and a best corner for a parasitic resistance of a wire. For example, the simulation result 810C is a result of the transient simulation under a fast corner for a cell (or transistor) and a best corner for a parasitic capacitance of a wire.

Figure 8B:
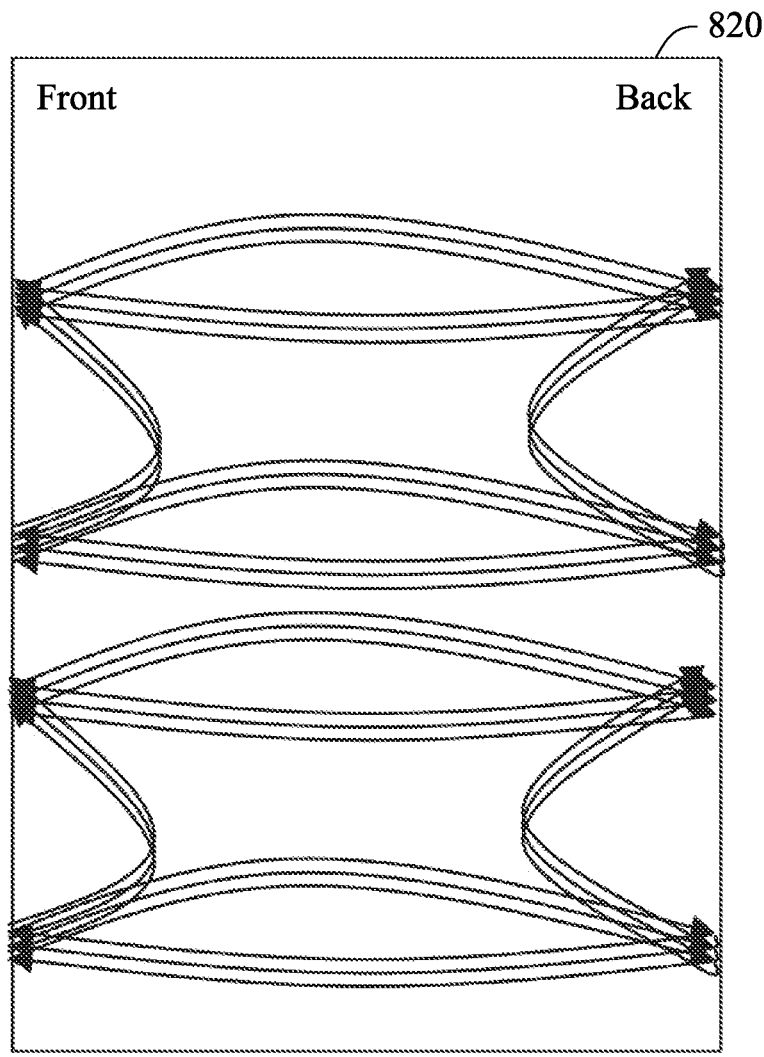
FIG. 8B is a diagram showing a timing model including multiple simulation results of a single die, in accordance with some embodiments.

FIG. 8B is a diagram showing a timing model 820 including multiple simulation results of a single die, in accordance with some embodiments. In one example, the model generator 660 may combine the simulation results 810A, 810B, 810C to generate the timing model 820.

Figure 8C:
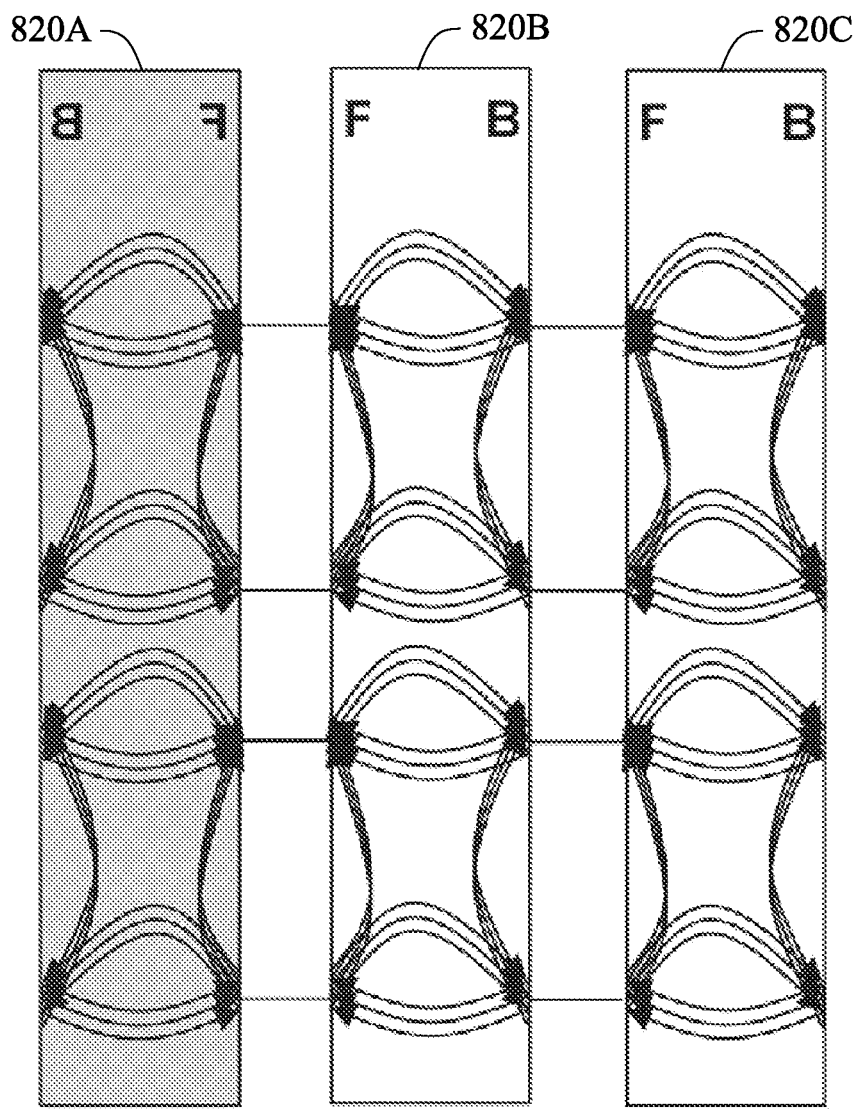
FIG. 8C is a diagram showing timing models in cascade, in accordance with some embodiments.

FIG. 8C is a diagram showing timing models 820A, 820B, 820C in cascade to simulate multiple dies 110A, 110B, 110C stacked along the direction (e.g., Y-direction), in accordance with some embodiments. The model generator 660 may generate replicates 820A, 820B, 820C of the timing model 810 of the single die 110. The replicates 820A, 820B, 820C of the timing model 810 may be in cascade. Each of the replicates 820A, 820B, 820C may represent a corresponding die 110. The simulator 650 may perform simulations of the integrated circuit 100 according to the replicates 820A, 820B, 820C of the timing model 810 in cascade. For example, the simulator 650 may perform timing analysis of a signal propagated from a first die (e.g., die 110A) to a last die (e.g., die 110C) through interface circuits 150 and metal rails 135, 155 of multiple dies 110 based on the replicates 820A, 820B, 820C of the timing model 810.

In one aspect, electrical loads of metal rails 135, 155 of multiple dies 110 are electrically isolated or separated among each other through interface circuits 150 of the multiple dies 110, such that each die 110 can be modeled independently. Hence, circuit simulation of a single die 110 can be performed for various process corners to generate the timing model 810, and replicates 820A, 820B, 820C of the timing model 810 can be generated to perform circuit simulation of multiple dies 110 stacked along the direction (e.g., Y-direction). By performing circuit simulation of multiple dies 110 based on replicates 820A, 820B, 820C of the timing model 810 rather than performing exhaustive circuit simulation of multiple dies 110 across various process corners, computational resources (e.g., storage space and processing power) for performing circuit simulation can be conserved.

Figure 9:
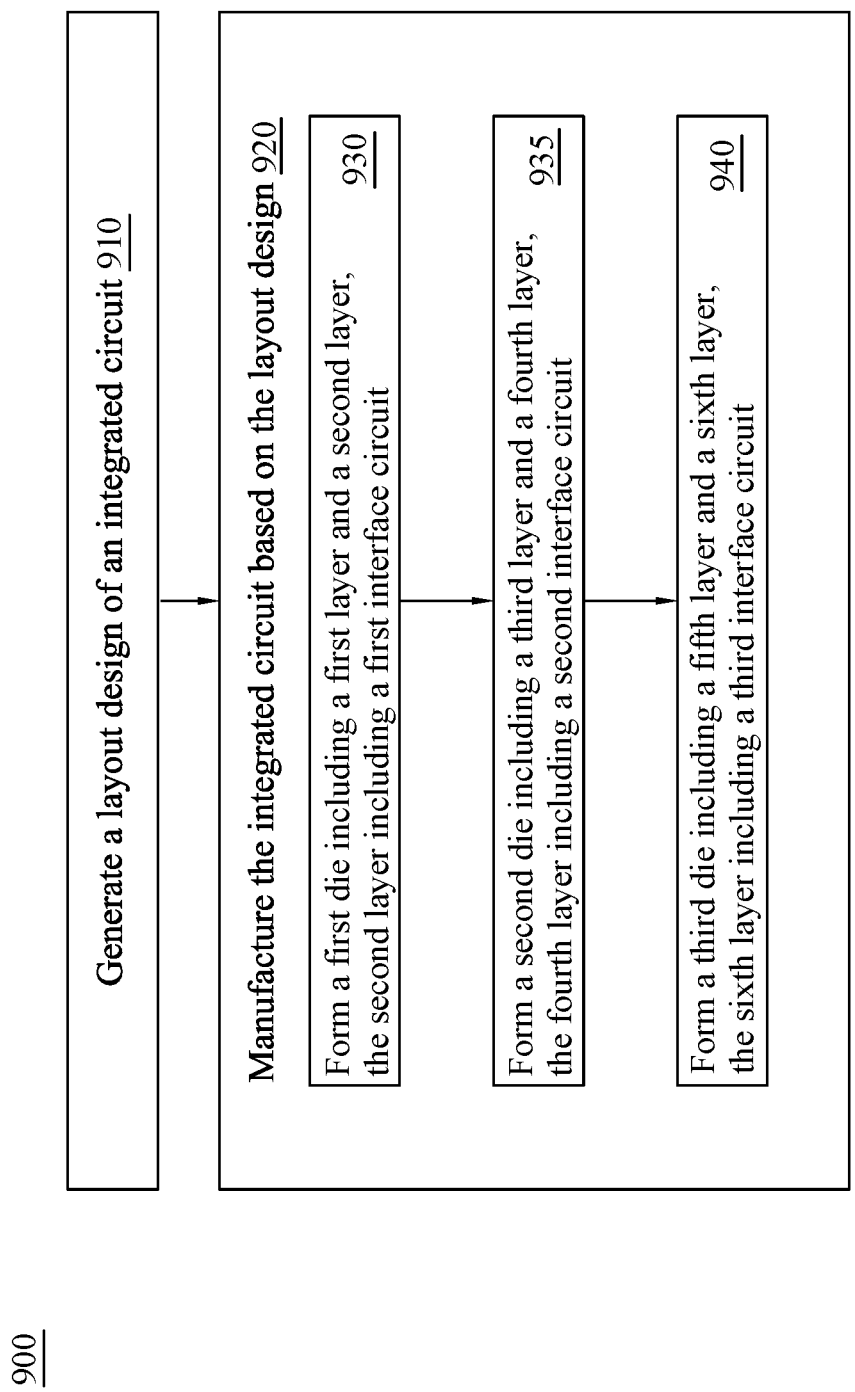
FIG. 9 is a flowchart of a method of manufacturing an integrated circuit, in accordance with some embodiments.

FIG. 9 is a flowchart of a method 900 of forming or manufacturing an integrated circuit in accordance with some embodiments. It is understood that additional operations may be performed before, during, and/or after the method 900 depicted in FIG. 9. In some embodiments, the method 900 is usable to form an integrated circuit according to various layout designs as disclosed herein.

In operation 910 of the method 900, a layout design of an integrated circuit is generated. The operation 910 is performed by a processing device (e.g., processor 615 of FIG. 6 or processor 1002 of FIG. 10) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format.

In operation 920 of the method 900, the integrated circuit is manufactured based on the layout design. In some embodiments, the operation 920 of the method 900 comprises manufacturing one or more masks based on the layout design, and manufacturing the integrated circuit based on the one or more masks. In one approach, the operation 920 includes operations 930, 935, 940.

In one approach, the operation 930 of the method 900 includes forming a first die (e.g., 110C) including a first layer (e.g., front layer 120C) and a second layer (e.g., back layer 115C). The first layer may be an insulating layer, and the second layer may be a semiconductor layer. The second layer may be formed or disposed above a direction (e.g., Y-direction). In some embodiments, the operation 930 includes forming metal rails through the first layer and the second layer. In one approach, a first metal rail (e.g., metal rail 155C) extends through the first layer along the direction (e.g., Y-direction), and a second metal rail (e.g., metal rail 135C) extends through the second layer along the direction (e.g., Y-direction). In some embodiments, the operation 930 includes forming a first interface circuit (e.g., interface circuit 150C) in the second layer. The first interface circuit may be configured to propagate a signal between the first metal rail and the second metal rail, while electrically separating between an electrical load of the first metal rail and an electrical load of the second metal rail.

In one approach, the operation 935 of the method 900 includes forming a second die (e.g., 110B) including a third layer (e.g., front layer 120B) and a fourth layer (e.g., back layer 115B). The third layer may be an insulating layer, and the fourth layer may be a semiconductor layer. The fourth layer may be formed or disposed above the direction (e.g., Y-direction). In some embodiments, the operation 935 includes forming metal rails through the third layer and the fourth layer. In one approach, a third metal rail (e.g., metal rail 155B) extends through the third layer along the direction (e.g., Y-direction), and a fourth metal rail (e.g., metal rail 135B) extends through the fourth layer along the direction (e.g., Y-direction). In one approach, a conductive bump (e.g., conductive bump 165BC) may be formed between the first die and the second die to electrically couple between the second metal rail and the third metal rail. In some embodiments, the operation 935 includes forming a second interface circuit (e.g., interface circuit 150B) in the fourth layer. The second interface circuit may be configured to receive the signal from the first interface circuit, and propagate the signal between the third metal rail and the fourth metal rail, while electrically separating between an electrical load of the third metal rail and an electrical load of the fourth metal rail.

In one approach, the operation 940 of the method 900 includes forming a third die (e.g., 110A) including a fifth layer (e.g., front layer 120A) and a sixth layer (e.g., back layer 115A). The fifth layer may be an insulating layer, and the sixth layer may be a semiconductor layer. The sixth layer may be formed or disposed above the direction (e.g., Y-direction). In some embodiments, the operation 940 includes forming metal rails through the fifth layer and the sixth layer. In one approach, a fifth metal rail (e.g., metal rail 155A) extends through the fifth layer along the direction (e.g., Y-direction), and a sixth metal rail (e.g., metal rail 135A) extends through the sixth layer along the direction (e.g., Y-direction). In one approach, a conductive bump (e.g., conductive bump 165AB) may be formed between the second die and the third die to electrically couple between the fourth metal rail and the fifth metal rail. In some embodiments, the operation 940 includes forming a third interface circuit (e.g., interface circuit 150A) in the sixth layer. The third interface circuit may be configured to receive the signal from the second interface circuit, and propagate the signal between the fifth metal rail and the sixth metal rail, while electrically separating between an electrical load of the fifth metal rail and an electrical load of the sixth metal rail.

Advantageously, the integrated circuit formed according to the method 900 can achieve speed improvement. By employing interface circuits to generate a replicate signal to transmit to a subsequent die while electrically isolating or separating electrical loads of metal rails in different dies, capacitive loading of metal rails through multiple dies can be reduced. By reducing the capacitive loading, speed of communication among different dies of the integrated circuit can be enhanced.

Figure 10:
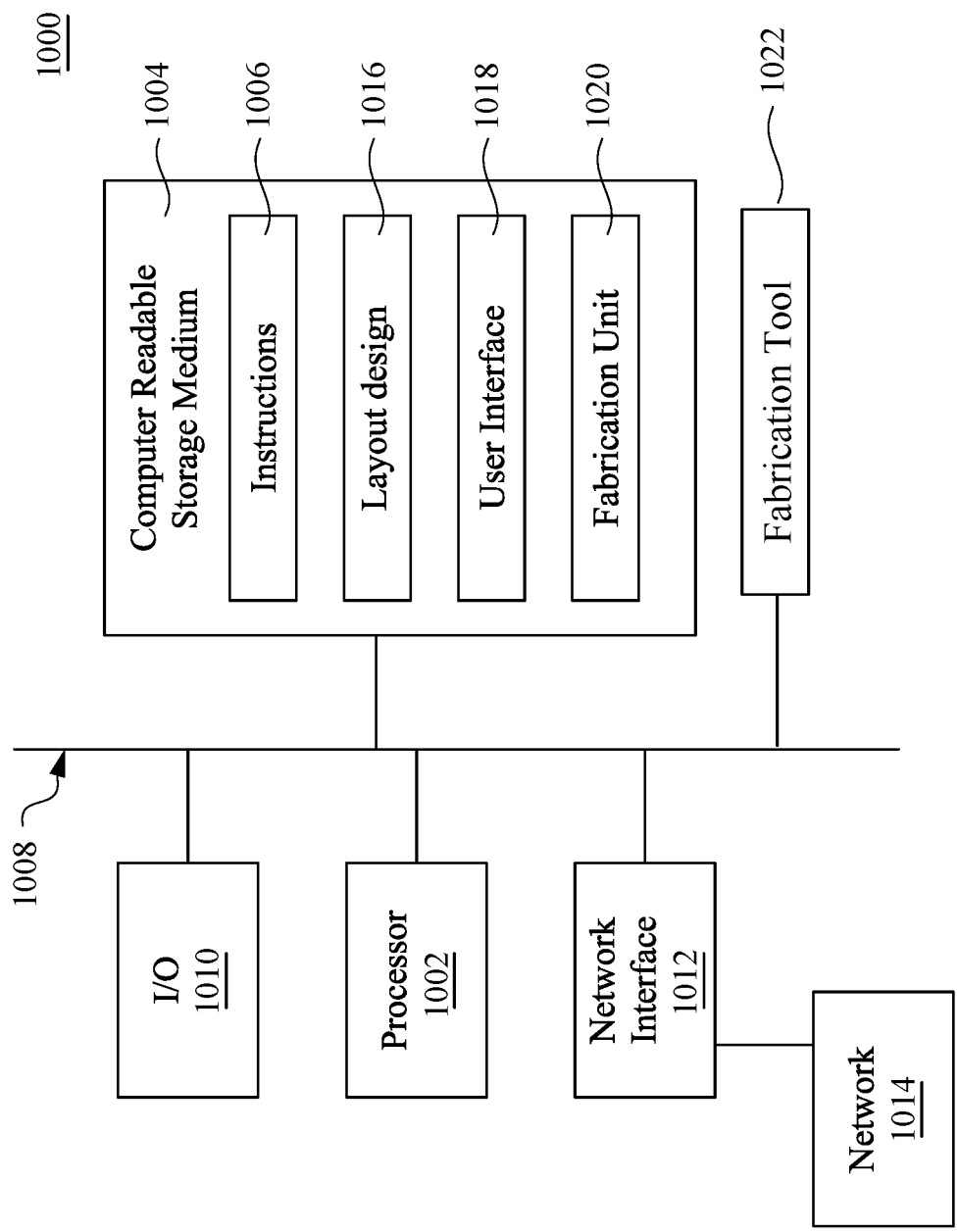
FIG. 10 is a block diagram of a system of generating an IC layout design, in accordance with some embodiments.

FIG. 10 is a schematic view of a system 1000 for designing and manufacturing an IC layout design in accordance with some embodiments. In some embodiments, the system 1000 generates or places one or more IC layout designs described herein. In some embodiments, the system 1000 manufactures one or more ICs based on the one or more IC layout designs described herein. The system 1000 includes a hardware processor 1002 and a non-transitory, computer readable storage medium 1004 encoded with, e.g., storing, the computer program code 1006, e.g., a set of executable instructions. Computer readable storage medium 1004 is configured for interfacing with manufacturing machines for producing the integrated circuit. The processor 1002 is electrically coupled to the computer readable storage medium 1004 by a bus 1008. The processor 1002 is also electrically coupled to an I/O interface 1010 by the bus 1008. A network interface 1012 is also electrically connected to the processor 1002 by the bus 1008. Network interface 1012 is connected to a network 1014, so that processor 1002 and computer readable storage medium 1004 are capable of connecting to external elements via network 1014. The processor 1002 is configured to execute the computer program code 1006 encoded in the computer readable storage medium 1004 in order to cause system 1000 to be usable for performing a portion or all of the operations as described in method 1000.

In some embodiments, the processor 1002 is a central processing unit (CPU), a multi-processor, a distributed processing system, an application specific integrated circuit (ASIC), and/or a suitable processing unit.

In some embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1004 includes a compact disk-read only memory (CD-ROM), a compact disk-read/write (CD-R/W), and/or a digital video disc (DVD).

In some embodiments, the storage medium 1004 stores the computer program code 1006 configured to cause system 1000 to perform method 900. In some embodiments, the storage medium 1004 also stores information needed for performing method 900 as well as information generated during performance of method 900, such as layout design 1016 and user interface 1018 and fabrication unit 1020, and/or a set of executable instructions to perform the operation of method 900.

In some embodiments, the storage medium 1004 stores instructions (e.g., computer program code 1006) for interfacing with manufacturing machines. The instructions (e.g., computer program code 1006) enable processor 1002 to generate manufacturing instructions readable by the manufacturing machines to effectively implement method 900 during a manufacturing process.

System 1000 includes I/O interface 1010. I/O interface 1010 is coupled to external circuitry. In some embodiments, I/O interface 1010 includes a keyboard, keypad, mouse, trackball, trackpad, and/or cursor direction keys for communicating information and commands to processor 1002.

System 1000 also includes network interface 1012 coupled to the processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interface such as ETHERNET, USB, or IEEE-13154. In some embodiments, method 900 is implemented in two or more systems 1000, and information such as layout design, user interface and fabrication unit are exchanged between different systems 1000 by network 1014.

System 1000 is configured to receive information related to a layout design through I/O interface 1010 or network interface 1012. The information is transferred to processor 1002 by bus 1008 to determine a layout design for producing an IC. The layout design is then stored in computer readable medium 1004 as layout design 1016. System 1000 is configured to receive information related to a user interface through I/O interface 1010 or network interface 1012. The information is stored in computer readable medium 1004 as user interface 1018. System 1000 is configured to receive information related to a fabrication unit through I/O interface 1010 or network interface 1012. The information is stored in computer readable medium 1004 as fabrication unit 1020. In some embodiments, the fabrication unit 1020 includes fabrication information utilized by system 1000.

In some embodiments, the method 900 is implemented as a standalone software application for execution by a processor. In some embodiments, the method 900 is implemented as a software application that is a part of an additional software application. In some embodiments, the method 900 is implemented as a plug-in to a software application. In some embodiments, the method 900 is implemented as a software application that is a portion of an EDA tool. In some embodiments, the method 900 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, the method 900 is implemented by a manufacturing device to manufacture an integrated circuit using a set of masks manufactured based on one or more layout designs generated by the system 1000. In some embodiments, system 1000 is a manufacturing device (e.g., fabrication tool 1022) to manufacture an integrated circuit using a set of masks manufactured based on one or more layout designs of the present disclosure. In some embodiments, system 1000 of FIG. 10 generates layout designs of an IC that are smaller than other approaches. In some embodiments, system 1000 of FIG. 10 generates layout designs of an IC that occupy less area than other approaches.

Figure 11:
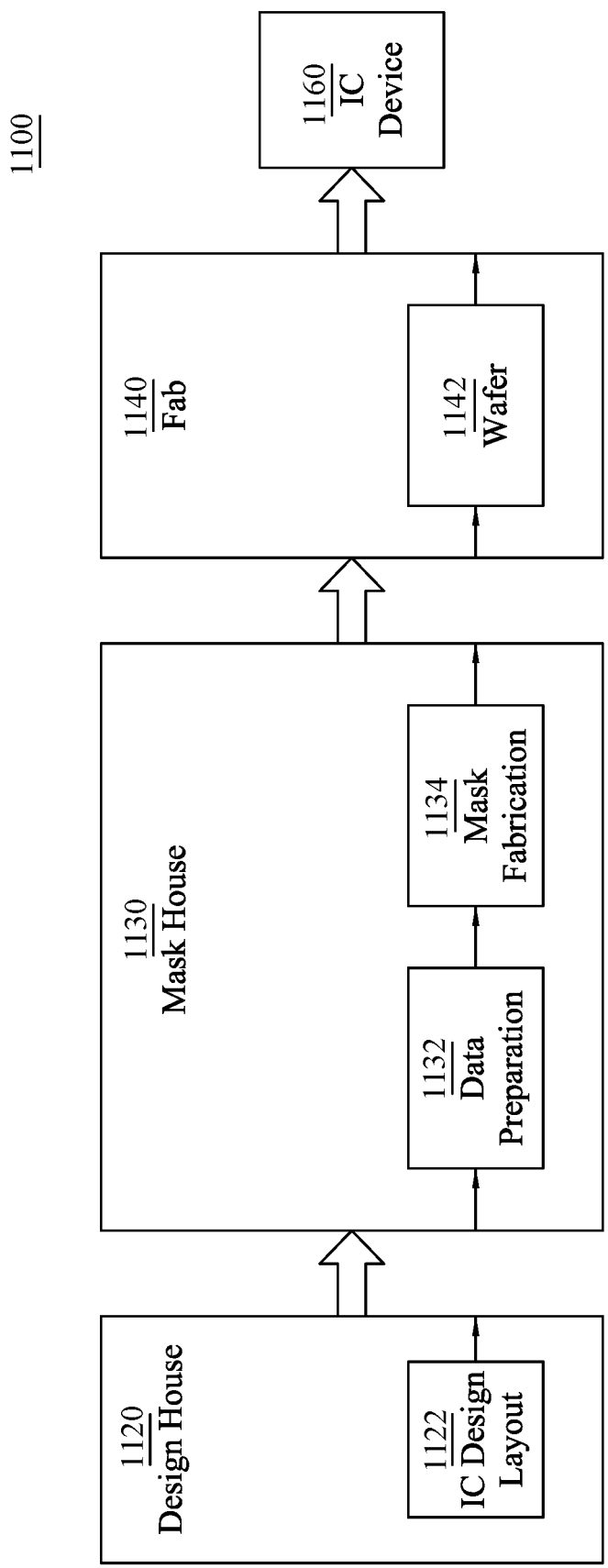
FIG. 11 is a block diagram of an IC manufacturing system, and an IC manufacturing flow associated therewith, in accordance with at least one embodiment of the present disclosure.

FIG. 11 is a block diagram of an integrated circuit (IC) manufacturing system 1100, and an IC manufacturing flow associated therewith, in accordance with at least one embodiment of the present disclosure.

In FIG. 11, IC manufacturing system 1100 includes entities, such as a design house 1120, a mask house 1130, and an IC manufacturer/fabricator ("fab") 1140, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1140 is owned by a single company. In some embodiments, two or more of design house 1120, mask house 1130, and IC fab 1140 coexist in a common facility and use common resources.

Design house (or design team) 1120 generates an IC design layout 1122. IC design layout 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout 1122 includes various IC features, such as an active region, gate region, source region and drain region, metal lines or via contacts of an interlayer interconnection, and openings for bonding pads, to be formed in a semiconductor substrate (such as a silicon wafer) and various material layers disposed on the semiconductor substrate. Design house 1120 implements a proper design procedure to form IC design layout 1122. The design procedure includes one or more of logic design, physical design or place and route. IC design layout 1122 is presented in one or more data files having information of the geometrical patterns. For example, IC design layout 1122 can be expressed in a GDSII file format or DFII file format.

Mask house 1130 includes mask data preparation 1132 and mask fabrication 1134. Mask house 1130 uses IC design layout 1122 to manufacture one or more masks to be used for fabricating the various layers of IC device 1160 according to IC design layout 1122. Mask house 1130 performs mask data preparation 1132, where IC design layout 1122 is translated into a representative data file ("RDF"). Mask data preparation 1132 provides the RDF to mask fabrication 1134. Mask fabrication 1134 includes a mask writer. A mask writer converts the RDF to an image on a substrate, such as a mask (reticle) or a semiconductor wafer. The design layout is manipulated by mask data preparation 1132 to comply with particular characteristics of the mask writer and/or requirements of IC fab 1140. In FIG. 11, mask data preparation 1132 and mask fabrication 1134 are illustrated as separate elements. In some embodiments, mask data preparation 1132 and mask fabrication 1134 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1134, which may undo part of the modifications performed by OPC in order to meet mask creation rules.

In some embodiments, mask data preparation 1132 includes lithography process checking (LPC) that simulates processing that will be implemented by IC fab 1140 to fabricate IC device 1160. LPC simulates this processing based on IC design layout 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine IC design layout 1122.

It should be understood that the above description of mask data preparation 1132 has been simplified for the purposes of clarity. In some embodiments, mask data preparation 1132 includes additional features such as a logic operation (LOP) to modify the IC design layout according to manufacturing rules. Additionally, the processes applied to IC design layout 1122 during mask data preparation 1132 may be executed in a variety of different orders.

After mask data preparation 1132 and during mask fabrication 1134, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1140 is an IC fabrication entity that includes one or more manufacturing facilities for the fabrication of a variety of different IC products. In some embodiments, IC fab 1140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1140 uses the mask (or masks) fabricated by mask house 1130 to fabricate IC device 1160. Thus, IC fab 1140 at least indirectly uses IC design layout 1122 to fabricate IC device 1160. In some embodiments, a semiconductor wafer 1142 is fabricated by IC fab 1140 using the mask (or masks) to form IC device 1160. Semiconductor wafer 1142 includes a silicon substrate or other proper substrate having material layers formed thereon. Semiconductor wafer further includes one or more of various doped regions, dielectric features, multilevel interconnects, and the like (formed at subsequent manufacturing steps).

System 1100 is shown as having design house 1120, mask house 1130 or IC fab 1140 as separate components or entities. However, it is understood that one or more of design house 1120, mask house 1130 or IC fab 1140 are part of the same component or entity.

Details regarding an integrated circuit (IC) manufacturing system (e.g., system 1100 of FIG. 11), and an IC manufacturing flow associated therewith are found, e.g., in U.S. Pat. Publication No. 9,256,709, granted Feb. 9, 2016, U.S. Pat. Application Publication No. 20150278429, published Oct. 1, 2015, U.S. Pat. Application Publication No. 20100040838, published Feb. 6, 2014, and U.S. Pat. Publication No. 7,260,442, granted Aug. 21, 2007, the entireties of each of which are hereby incorporated by reference.

One aspect of this description relates to an integrated circuit. In some embodiments, the integrated circuit includes a first die and a second die disposed above the first die along a direction. In some embodiments, the second die includes a first layer and a second layer disposed above the first layer along the direction. In some embodiments, the second die includes a first metal rail extending through the first layer along the direction to electrically couple to the first die, and a second metal rail extending through the second layer along the direction. In some embodiments, the second die includes a first interface circuit disposed in the second layer. In some embodiments, the first interface circuit is configured to propagate a signal between the first metal rail and the second metal rail, while electrically isolating between electrical loads of the first metal rail and the second metal rail.

One aspect of this description relates to an integrated circuit including a first die, a second die, and a third die stacked along a direction. In some embodiments, the first die includes a first interface circuit to generate a signal. In some embodiments, the second die is disposed above the first die along the direction. In some embodiments, the second die includes a second interface circuit to receive the signal from the first interface circuit and generate a replicate signal according to the signal. In some embodiments, the third die is disposed above the second die along the direction. In some embodiments, the third die includes a third interface circuit to receive the replicate signal from the second interface circuit.

One aspect of this description relates to a method of generating a layout design of an integrated circuit. In some embodiments, the method includes performing, by a processor, a first simulation for a die of the integrated circuit across process corners. In some embodiments, the method includes generating, by the processor, a timing model of the die according to the first simulation. In some embodiments, the method includes performing, by the processor, a second simulation for multiple dies of the integrated circuit stacked along a direction. Each of the multiple dies may be represented by the timing model. In some embodiments, the method includes generating, by the processor, the layout design of the integrated circuit including the multiple dies stacked along the direction based on the second simulation.

One aspect of this description relates to a method of forming an integrated circuit. In some embodiments, the method includes forming a first layer of a first die. In some embodiments, the method includes forming a first metal rail extending through the first layer along a direction. In some embodiments, the method includes forming a second layer of the first die along the direction. In some embodiments, the method includes forming a second metal rail extending through the second layer along the direction. In some embodiments, the method includes forming a first interface circuit in the second layer. In some embodiments, the first interface circuit is configured to propagate a signal between the first metal rail and the second metal rail, while electrically separating between an electrical load of the first metal rail and an electrical load of the second metal rail. In some embodiments, the method includes forming a third layer of a second die. In some embodiments, the method includes forming a third metal rail extending through the third layer along the direction. In some embodiments, the method includes forming a fourth layer of the second die along the direction. In some embodiments, the method includes forming a second interface circuit in the fourth layer. In some embodiments, the second interface circuit is configured to receive the signal from the first interface circuit through the third metal rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first die including a first interface circuit;
a second die disposed above and operatively coupled to the first die, and including a second interface circuit; and
a third die disposed below and operatively coupled to the first die, and including a third interface circuit;
wherein each of the first to third interface circuits is configured to propagate a signal between a first metal rail and a second metal rail of a corresponding one of the first to third dies, while being configured to electrically isolate between an electrical load of the first metal rail and an electrical load of the second metal rail of any other one of the first to third dies.

2. The integrated circuit of claim 1, wherein
the first die comprises a first front layer and a first back layer;
the second die comprises a second front layer and a second back layer, the second front layer facing the first back layer; and
the third die comprises a third front layer and a third back layer, the third back layer facing the first front layer.

3. The integrated circuit of claim 2, wherein the first interface circuit is disposed in the first back layer, with the first metal rail and the second metal rail of the first die extending through the first front layer and the first back layer, respectively.

4. The integrated circuit of claim 2, wherein the second interface circuit is disposed in the second back layer, with the first metal rail and the second metal rail of the second die extending through the second front layer and the second back layer, respectively.

5. The integrated circuit of claim 2, wherein the third interface circuit is disposed in the third back layer, with the first metal rail and the second metal rail of the third die extending through the third front layer and the third back layer, respectively.

6. The integrated circuit of claim 1, wherein the signal is a data signal, wherein the first to third interface circuits each include a first buffer circuit.

7. The integrated circuit of claim 6, wherein the first buffer circuit of the first interface circuit is configured to:
receive the data signal through the corresponding second metal rail;
generate a replicate data signal of the data signal; and
transmit the replicate data signal to the third interface circuit through the corresponding first metal rail.

8. The integrated circuit of claim 6, wherein the first to third interface circuits each include a second buffer circuit.

9. The integrated circuit of claim 8, wherein the second buffer circuit of the first interface circuit is configured to:
receive a clock signal through the corresponding second metal rail;
generate a replicate clock signal of the clock signal; and
transmit the replicate clock signal to the third interface circuit through the corresponding first metal rail.

10. An integrated circuit comprising:
a first die including a first front layer and a first back layer, with a first interface circuit disposed in the first back layer;
a second die including a second front layer and a second back layer, with a second interface circuit disposed in the second back layer; and
a third die including a third front layer and a third back layer, with a third interface circuit disposed in the third back layer;

wherein each of the first to third interface circuits is configured to propagate a signal between a first metal rail and a second metal rail of a corresponding one of the first to third dies, while being configured to electrically isolate between an electrical load of the first metal rail and an electrical load of the second metal rail of any other one of the first to third dies.

11. The integrated circuit of claim 10, wherein the second die is disposed above and operatively coupled to the first die with the first back layer facing the second front layer, and the third die disposed below and operatively coupled to the first die with the third back layer facing the first front layer.

12. The integrated circuit of claim 10, wherein the first metal rail and the second metal rail of the first die extend through the first front layer and the first back layer, respectively.

13. The integrated circuit of claim 10, wherein the first metal rail and the second metal rail of the second die extend through the second front layer and the second back layer, respectively.

14. The integrated circuit of claim 10, wherein the first metal rail and the second metal rail of the third die extend through the third front layer and the third back layer, respectively.

15. The integrated circuit of claim 10, wherein the signal is a data signal, wherein the first to third interface circuits each include a first buffer circuit.

16. The integrated circuit of claim 15, wherein the first buffer circuit of the first interface circuit is configured to:

receive the data signal through the corresponding second metal rail;

generate a replicate data signal of the data signal; and transmit the replicate data signal to the third interface circuit through the corresponding first metal rail.

17. The integrated circuit of claim 15, wherein the first to third interface circuits each include a second buffer circuit.

18. The integrated circuit of claim 17, wherein the second buffer circuit of the first interface circuit is configured to:

receive a clock signal through the corresponding second metal rail;

generate a replicate clock signal of the clock signal; and transmit the replicate clock signal to the third interface circuit through the corresponding first metal rail.

* * * * *